United States Patent
Lu et al.

(10) Patent No.: US 8,952,349 B2
(45) Date of Patent: Feb. 10, 2015

(54) SWITCHING DEVICE HAVING A NON-LINEAR ELEMENT

(71) Applicant: Crossbar, Inc., Santa Clara, CA (US)

(72) Inventors: Wei Lu, Ann Arbor, MI (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/960,735

(22) Filed: Aug. 6, 2013

(65) Prior Publication Data

US 2014/0034898 A1 Feb. 6, 2014

Related U.S. Application Data

(63) Continuation of application No. 13/149,757, filed on May 31, 2011, now Pat. No. 8,502,185.

(51) Int. Cl.
| | |
|---|---|
| H01L 45/00 | (2006.01) |
| H01L 21/06 | (2006.01) |
| G11C 11/00 | (2006.01) |
| H01L 27/24 | (2006.01) |
| H01L 27/10 | (2006.01) |

(52) U.S. Cl.
CPC .......... *H01L 27/2409* (2013.01); *H01L 27/101* (2013.01); *H01L 45/085* (2013.01); *H01L 45/1233* (2013.01); *H01L 45/148* (2013.01); *H01L 27/2463* (2013.01)
USPC .............. 257/4; 257/2; 257/3; 257/5; 257/95; 257/97; 257/382; 257/E21.004; 257/E21.068; 257/E27.004; 257/E45.002; 257/E47.001; 365/129; 365/148; 365/163; 438/3; 438/4; 438/5; 438/95; 438/97; 438/382

(58) Field of Classification Search
CPC .................................................. H01L 27/2409
USPC ............. 257/2, 3, 4, 5, 95, 97, 382, E21.004, 257/E21.068, E27.004, E45.002, E47.001; 365/129, 148, 163; 438/3, 4, 5, 95, 97, 438/382

See application file for complete search history.

(56) References Cited

U.S. PATENT DOCUMENTS

| | | | |
|---|---|---|---|
| 6,849,891 B1 | 2/2005 | Hsu et al. | |
| 7,704,788 B2 * | 4/2010 | Youn et al. | .................... 438/102 |

(Continued)

FOREIGN PATENT DOCUMENTS

| | | |
|---|---|---|
| JP | 2011-23645 A | 2/2011 |
| WO | WO 2011/005266 A1 | 1/2011 |

OTHER PUBLICATIONS

International Search Report and Written Opinion for PCT Patent Application No. PCT/US2012/040232 filed on May 31, 2012.

(Continued)

*Primary Examiner* — Dao H Nguyen
(74) *Attorney, Agent, or Firm* — Ogawa P.C.

(57) ABSTRACT

A switching device includes a substrate; a first electrode formed over the substrate; a second electrode formed over the first electrode; a switching medium disposed between the first and second electrode; and a nonlinear element disposed between the first and second electrodes and electrically coupled in series to the first electrode and the switching medium. The nonlinear element is configured to change from a first resistance state to a second resistance state on application of a voltage greater than a threshold.

12 Claims, 8 Drawing Sheets

(56) References Cited

U.S. PATENT DOCUMENTS

| | | | |
|---|---|---|---|
| 7,830,698 B2 * | 11/2010 | Chen et al. | 365/148 |
| 8,369,139 B2 | 2/2013 | Liu et al. | |
| 8,502,185 B2 * | 8/2013 | Lu et al. | 257/4 |
| 2004/0170040 A1 | 9/2004 | Rinerson et al. | |
| 2007/0159869 A1 | 7/2007 | Baek et al. | |
| 2008/0048164 A1 | 2/2008 | Odagawa | |
| 2009/0109728 A1 | 4/2009 | Maejima et al. | |
| 2009/0231910 A1 * | 9/2009 | Liu et al. | 365/163 |
| 2010/0140614 A1 | 6/2010 | Uchiyama et al. | |
| 2010/0243983 A1 | 9/2010 | Chiang et al. | |
| 2011/0089391 A1 | 4/2011 | Mihnea et al. | |
| 2011/0317470 A1 * | 12/2011 | Lu et al. | 365/148 |
| 2012/0122290 A1 | 5/2012 | Nagashima | |
| 2013/0214234 A1 | 8/2013 | Gopalan et al. | |

OTHER PUBLICATIONS

Notice of Allowance for U.S. Appl. No. 13/585,759 dated Sep. 19, 2013.
Office Action for U.S. Appl. No. 13/921,157 dated Oct. 3, 2013.
Office Action for U.S. Appl. No. 13/960,735, dated Dec. 6, 2013.
International Search Report and Written Opinion for PCT/US2013/054976, filed on Aug. 14, 2013.
Notice of Allowance for U.S. Appl. No. 13/592,224, dated Mar. 17, 2014.
Office Action for U.S. Appl. No. 13/426,869 dated Sep. 12, 2014.
Notice of Allowance for U.S. Appl. No. 13/426,869, dated Oct. 21, 2014.
Notice of Allowance for U.S. Appl. No. 13/960,735, dated Sep. 17, 2014.

* cited by examiner

SWITCHING DEVICE HAVING A NON-LINEAR ELEMENT

CROSS REFERENCE TO RELATED APPLICATIONS

The instant application claims priority to and is a continuation of U.S. patent application Ser. No. 13/149,757, filed May 31, 2011, which is hereby incorporated by reference herein for all purposes.

BACKGROUND

The present invention is related to switching devices. More particularly, the present invention provides a structure and a method for forming non-volatile resistive switching memory devices characterized by a suppression of current at low bias and a high measured ON/OFF resistance ratio.

The success of semiconductor devices has been mainly driven by an intensive transistor down-scaling process. However, as field effect transistors (FET) approach sizes less than 100 nm, problems such as short channel effect start to prevent proper device operation. Moreover, such sub 100 nm device size can lead to sub-threshold slope non-scaling and increased power dissipation. It is generally believed that transistor based memories such as those commonly known as Flash memory may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon based devices to form a memory cell, which lack one or more key attributes. For example, Fe-RAM and MRAM devices have fast switching characteristics and good programming endurance, but their fabrication is not CMOS compatible and size is usually large. Switching for a PCRAM device uses joules heating, which inherently has high power consumption. Organic RAM or ORAM is incompatible with large volume silicon based fabrication and device reliability is usually poor.

As integration of memory devices increases, the size of elements is reduced while the density of elements in a given area is increased. As a result, dark current of leakage current becomes more of a problem, where leakage current can return a false result for a read operation or cause an unintentional state change in a cell. The problem of leakage current is particularly acute in two-terminal devices, in which multiple memory cells can form leakage paths through interconnecting top and bottom electrodes.

Conventional approaches to suppressing leakage current in switching devices include coupling a vertical diode to a memory element. However, the external diode approach has several disadvantages. In general, the diode fabrication process is a high temperature process, typically conducted above 500 degrees Celsius. Because most diodes rely on a P/N junction, it is difficult to scale the diode height to achieve a memory and diode structure with a desirable aspect ratio. And finally, a conventional diode is only compatible with a unipolar switching device, and not a two-way bipolar device. It is therefore desirable to have a robust and scalable method and structure for a highly integrated memory that is not adversely affected by leak currents.

BRIEF SUMMARY OF THE INVENTION

The present invention is generally related to switching devices. More particularly, the present invention provides a structure and a method for forming a non-volatile memory cell using resistive switching. It should be recognized that embodiments according the present invention have a much broader range of applicability.

In a specific embodiment, a switching device includes a substrate; a first electrode formed over the substrate; a second electrode formed over the first electrode; a switching medium disposed between the first and second electrode; and a nonlinear element disposed between the first and second electrodes and electrically coupled in series to the first electrode and the switching medium. The nonlinear element is configured to change from a first resistance state to a second resistance state on application of a voltage greater than a threshold.

The switching device includes a RRAM in an embodiment.

The switching device include a PCRAM in an embodiment.

The present invention has a number of advantages over conventional techniques. For example, embodiments of the present invention allow for a high density non-volatile memory characterized by high switching speed, low leakage current characteristic, and high device yield. Depending on the embodiment, one or more of these may be achieved. These and other advantages will be described below in more detail in the present specification.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE PRESENT INVENTION

The present invention is generally directed to a memory device. More particularly, the present invention provides a structure and a method for a resistive switching cell having a nonlinear element. The switching cell may be used in a Resistive Random Access Memory (RRAM) or any highly integrated device. It should be recognized that embodiments of the present invention can have a broader range of applicability. Although the present invention is described with respect to specific embodiments, the embodiments are only used for illustrative purposes and should not be considered limiting.

RRAM is typically a two terminal device in which a switching element is sandwiched between a top electrode and a bottom electrode. The resistance of the switching element is varied by applying a voltage to the electrodes or a current through the switching element. Resistive switching can be bipolar or unipolar. In bipolar switching, the change in resistance of the switching element depends on polarity and a magnitude of a current or voltage based applied electrical signal. In the case of unipolar switching, the change in resistance of the switching element depends only on the magnitude of the applied voltage or current and typically is a result of Joule heating within the switching element. Embodiments of the present invention are explained with respect to a two-terminal RRAM device using bipolar switching, but are not limited thereto. As used herein, the terms "RRAM" or "resistive memory cell" refer to a memory cell or memory device that uses a switching medium whose resistance can be controlled by applying an electrical signal without ferroelectricity, magnetization, and phase change of the switching medium. The present invention is not limited to implementation in RAM, e.g., the invention may be implemented using the phase change RAM.

Figure 1:
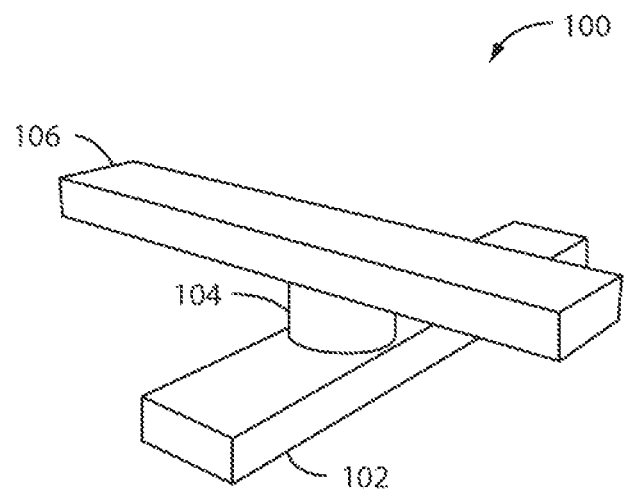
FIG. 1 illustrates a non-volatile memory device including a memory cell that has a bottom electrode, a switching medium, and a top electrode according to an embodiment of the present invention.

FIG. 1 illustrates a resistive memory cell 100 in a non-volatile memory device, e.g., a semiconductor memory chip. The memory cell includes a bottom electrode 102, a switching medium 104, and a top electrode 106 according an embodiment of the present invention. The switching medium 104 exhibits a resistance that can be selectively set to various values and reset using appropriate control circuitry. The memory cell 100 is a two-terminal resistive memory device, e.g., RRAM, in the present embodiment. Terms such as "top" of "bottom" are used for illustrative purpose only and should not construe to be limiting.

In the present embodiment, the memory cell 100 is an amorphous-silicon-based resistive memory cell and uses amorphous silicon (a-Si) as the switching medium 104. The resistance of the switching medium 104 changes according to formation or retrieval of a conductive filament inside the switching medium 104 according to a voltage applied to the electrodes. In an embodiment, the switching medium 104 is substantially free of dopants. In another embodiment, the switching medium 104 is a-Si doped with boron. The top electrode 106 is a conductive layer containing silver (Ag) and acts as the source of filament-forming ions in the a-Si structure. Although silver is used in the present embodiment, it will be understood that the top electrode 106 can be formed from various other suitable metals, such as gold (Au), nickel (Ni), aluminum (Al) chromium (Cr), iron (Fe), manganese (Mn) tungsten (W), vanadium (V), and cobalt (Co). In certain embodiments, the bottom electrode 102 is pure metal, a boron-doped electrode, or other p-type polysilicon or silicon-germanium, which is in contact with a lower-end face of the a-Si structure. In an embodiment, the memory cell 100 is configured to store more than a single bit of information, e.g., by adjusting the external circuit resistance, as explained in U.S. patent application Ser. No. 12/575,921, filed on Oct. 9, 2009, which is entitled "Silicon-Based Nanoscale Resistive Device with Adjustable Resistance" and is incorporated by reference in its entirety.

Figure 2:
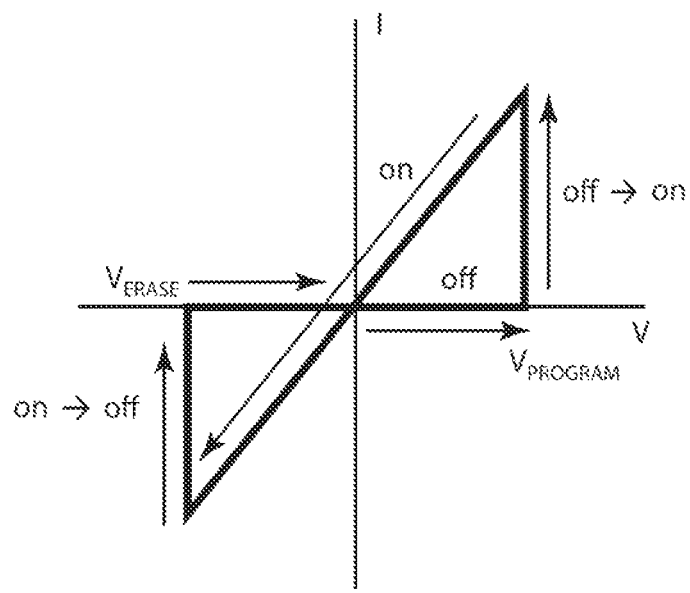
FIG. 2 illustrates I-V resistance switching characteristics of a resistive memory cell.

FIG. 2 illustrates resistance switching characteristics of the memory cell 100 according to an embodiment of the present invention. The switching medium 104 displays a bipolar switching effect. The resistance of the switching medium 104 changes depending on the polarity and magnitude of the voltage signal applied to the switching medium 104 via the top electrode 106 and the bottom electrodes 102. The memory cell 100 is changed into an ON state (low resistance state) when a positive voltage equal to or greater than a threshold program voltage (also referred to as a "program voltage") $V_{PROGRAM}$ is applied. In an embodiment, the program voltage ranges between 1 volt to 5 volts depending on the materials used for the switching medium 104 and the top electrode 106. In another embodiment, the program voltage ranges between 1 volt and 3 volts. The memory cell 100 is switched back to an OFF state (high resistance state) when a negative voltage equal to or greater than a threshold erase voltage (also referred to as "erase voltage") $V_{ERASE}$ is applied. In an embodiment, the erase voltage ranges from −2 volts to −5 volts. The cell state is not affected if the voltage applied is between two threshold voltages $V_{PROGRAM}$ and $V_{ERASE}$, which enables a low-voltage read process. Once the memory cell 100 is set to a specific resistance state, the memory cell 100 retains the information for a certain period (or retention time) without electrical power.

FIG. 2 illustrates a current-voltage (I-V) relationship through a switching operation of a non-rectifying memory cell 100. Electrical current flows from the top electrode 106 to the bottom electrode 102 when the potential applied to the top electrode 106 is positive potential with respect to the bottom electrode 102. On the other hand, current flows in the reverse direction if the potential applied to the top electrode 106 is negative with respect to the bottom electrode 102.

Figure 3A:
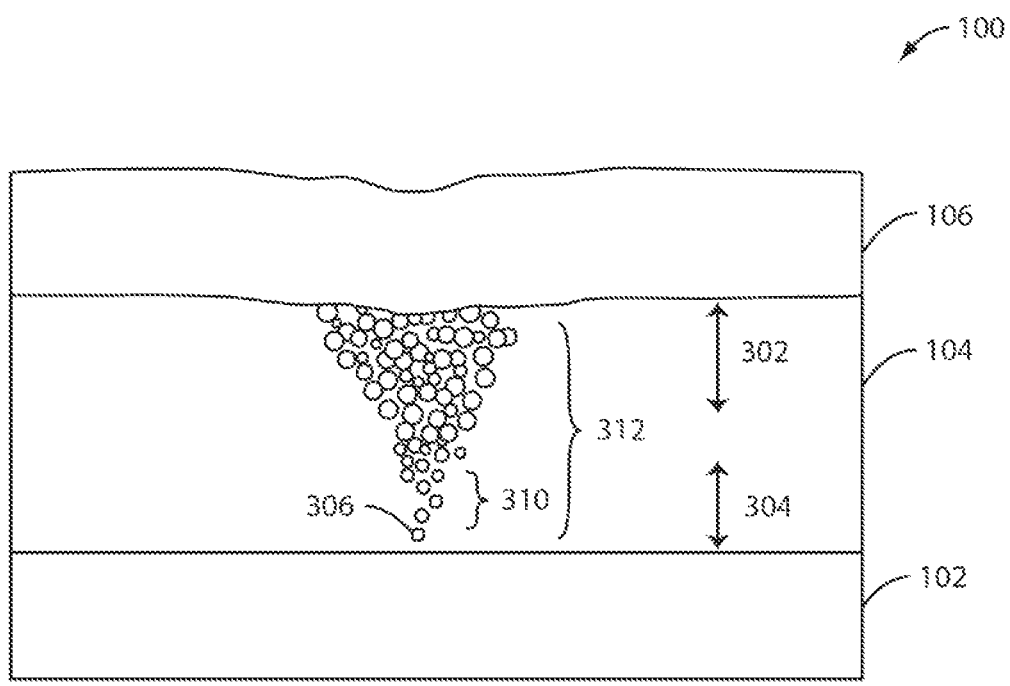
FIG. 3A illustrates a two-terminal memory cell that is placed in an ON state by applying a program voltage $V_{PROGRAM}$ to the top electrode.
Figure 3B:
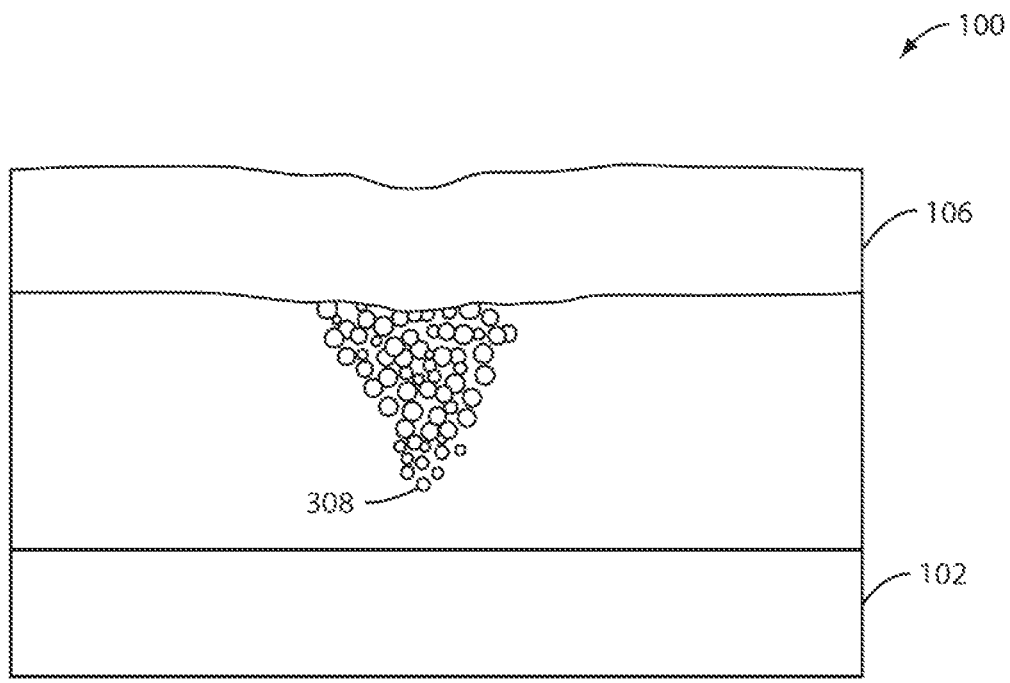
FIG. 3B illustrates a two-terminal memory cell that is placed in an OFF state by applying an erase voltage $V_{ERASE}$ to the top electrode.

FIGS. 3A and 3B illustrate a switching, mechanism of the memory cell 100 during the ON and OFF states according to an embodiment of the present invention. The switching in the switching medium 104 is based on formation and retrieval of a conductive filament, or a plurality of filaments, in a filament region in the switching medium 104 according to the program and the erase voltages applied to the bottom electrode 102 and the top electrode 106 of the memory cell 100.

FIG. 3A illustrates the memory cell 100 that is placed in an ON state by applying the program voltage $V_{PROGRAM}$ to the top electrode 106. The switching medium 104, made of a-Si, is provided between the bottom electrode 102 and the top electrode 106. An upper portion of the switching medium 104 includes a metallic region (or conductive path) 302 that extends from the top electrode 106 to approximately 10 nm above the bottom electrode 102. The metallic region 302 is formed during an electroforming process when a slightly larger voltage than a subsequent switching voltage, e.g., 3~5 V, is applied to the top electrode 106. This large voltage causes the electric field-induced diffusion of the metal ions from the top electrode 106 toward the bottom electrode 102, thereby forming a continuous conductive path 312. A lower portion of the switching medium 104 defines a filament region 304, wherein the filament 310 is formed when the program voltage $V_{PROGRAM}$ is applied after the electroforming process. The continuous conductive path 312 and the filament 310 can also be formed together during the electroforming process. The filament 310 comprises a series of metal particles, which are trapped in defect sites in a lower portion of the switching medium 104 when the program voltage $V_{PROGRAM}$ applied provides sufficient activation energy to push a number of metal ions from the metallic region 302 toward the bottom electrode 102.

The filament 310 is believed to be comprised of a collection of metal particles that are separated from each other by the non-conducting switching medium 104 and that do not define a continuous conductive path, unlike the continuous conductive path 312 in the metallic region 302. The filament 310 extends about 2 to 10 nm depending on implementation. The conduction mechanism in an ON state is electrons tunneling through the metal particles in the filament 310. The cell resistance is dominated by the tunneling resistance between the metal particle 306 and the bottom electrode 102. The metal particle 306 is a metal particle in the filament region 304 that is closest to the bottom electrode 102 and that is the last metal particle in the filament region 304 in an ON state.

FIG. 3B illustrates the memory cell 100 that is placed in an OFF state by applying an erase voltage $V_{ERASE}$ to the top electrode 106. The erase voltage exerts sufficient electromagnetic force to dislodge the metal particles trapped in the defects sites of the a-Si and retrieves at least part of the filament 310 from the filament region 304. The metal particle 308 that is closest to the bottom electrode 102 in an OFF state is separated from the bottom electrode 102 by a distance greater than the metal particle 306 during an ON state. This increased distance between the metal particle 308 and the bottom electrode 102 places the memory cell 100 in a high resistance state compared to an ON state. In an embodiment, the resistance ratio between ON/OFF states ranges from 10E3 to 10E7. Memory cell 100 behaves like a resistor in an ON state and a capacitor in an OFF state (i.e., the switching medium 104 does not conduct a current in any meaningful amount and behaves as a dielectric in an OFF state), in an implementation, the resistance is 10E5 Ohm in an ON state and 10E10 Ohm in an OFF state. In another implementation, the resistance is 10E4 Ohm in an ON state and 10E9 Ohm in an OFF state. In yet another implementation, the resistance is at least 10E7 Ohm in an OFF state.

Figure 4:
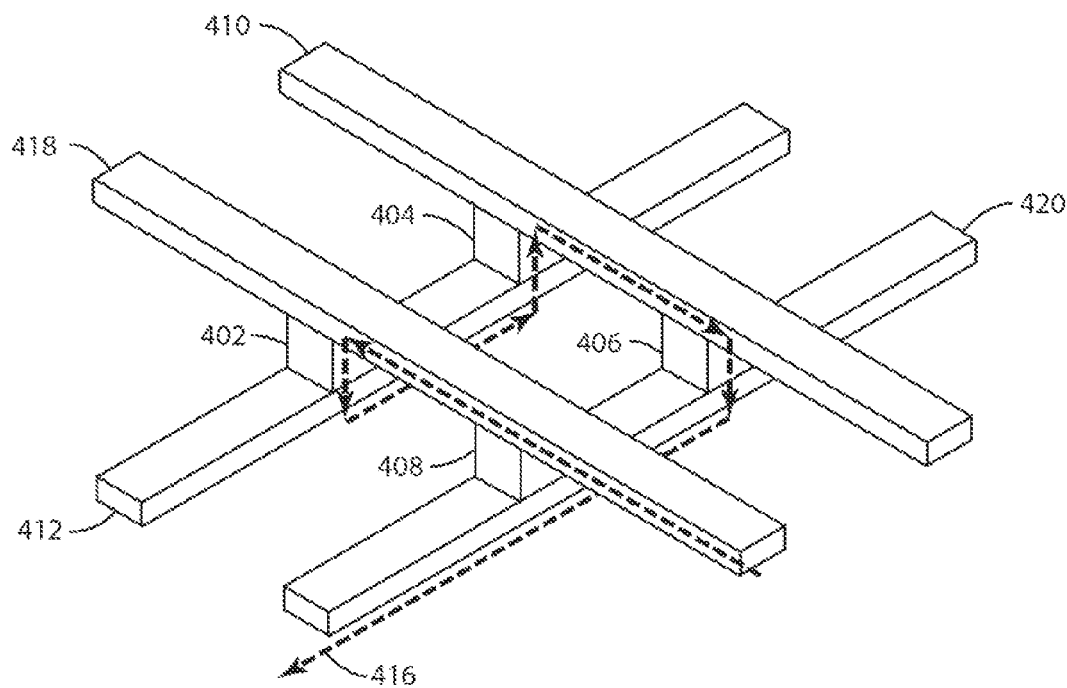
FIG. 4 illustrates a memory array including a leakage current.

FIG. 4 illustrates a portion of an array 400 that is in a crossbar configuration in which the top electrode and the bottom electrode are arranged in an orthogonal manner according to an embodiment of the present invention. An array of such crossbar structures includes a plurality of parallel top electrodes and a plurality of parallel bottom electrodes with switching elements disposed between the intersection regions of the top electrodes and the bottom electrodes. Certain limitations may exist in such a configuration, as described below.

Four memory cells 402, 404, 406, and 408 are shown. Memory cells 404 and 406 share a common first top electrode 410, while cells 402 and 408 share a common second top electrode 418. The first top electrode 410 and the second top electrode 418 are arranged parallel to each other. Memory cells 402 and 404 share a common first bottom electrode 412 and cells 406 and 408 share a common second bottom electrode 420. The first bottom electrode 412 and the second bottom electrode 420 are spatially arranged parallel to each other. In addition, each of the top electrodes is configured to be non-parallel to each of the bottom electrodes.

To determine a state of a target cell which has a high resistance state, a voltage is applied and a current flowing through the target cell is measured. If some cells in the crossbar array are in low resistance states, the voltage applied to the target cell can cause a leakage current to flow through the untargeted cells instead. In this case the cells causing the leakage, including the target cell, are interconnected through shared electrodes. The leakage current can form a current path, commonly known as a sneak current or a sneak current path, through these untargeted cells. Such a sneak current can cause undesirable behavior in a switching array.

For example, in an exemplary array, cells 402, 404, and 406 are at a low resistance ON state, and cell 408 is at a high resistance OFF state. Because the ON state is characterized by a low resistance, a sneak path 416 may be formed allowing current to flow through cells 402, 404, and 406. Thus, when a read voltage is applied to target cell 408, leakage current flowing along sneak path 416 may cause an erroneous reading of an ON state result.

In some embodiments, a sneak path can be very short, existing in as few as two forward biased cells and one reverse biased cell. In addition, once started, a sneak path can propagate throughout the array through cells in the ON state. The most common conductive path in a switching array is the shared top and bottom electrodes. Sneak path 416 is only one example of a sneak path passing leakage current through an array.

To mitigate problems caused by leakage current in a switching array, a nonlinear element (NLE) may be included in a resistive switching device. NLEs can be generally divided into two categories: an NLE that exhibits digital-like behavior, or "digital NLE," and an NLE that exhibits analog-like behavior, or an "analog NLE," both of which are described in detail separately below. The categories of digital and analog behavior are not strictly defined, so it is possible for a particular NLE to have properties that are characteristic of both digital and analog behavior, or somewhere in between. In its most basic form, an NLE is an element that has a nonlinear response with respect to voltage, for instance, with a nonlinear I-V relationship. In most embodiments, the relationship is characterized by a high resistance state at low amplitude voltages and a lower resistance state at higher amplitude voltages, with a nonlinear transition from the high resistance state to the low resistance state. Unlike a switching medium, an NLE does not have a memory characteristic; an NLE returns to an original state when a voltage is no longer applied. An NLE that is suitable for suppressing leak currents is characterized by a high resistance state at a low bias, a lower resistance state at a higher bias, and a threshold between the states.

In an embodiment, an NLE is a two terminal device which shows an apparent threshold effect such that the resistance measured below a first voltage is significantly higher than the resistance measured above a second voltage. In a typical embodiment, the resistance below the first voltage is more than 100 times greater than the resistance above the second voltage. In some embodiments, the first and second voltages are different, and are typically referred to as a hold voltage $V_{HOLD}$ and threshold voltage $V_{TH}$, respectively. In other embodiments, the first voltage and second voltage may be the same. In various embodiments, these relationships may exist in both polarities of voltage, or only in one polarity, and the NLE can be a single material or multiple layers of different materials.

Figure 5:
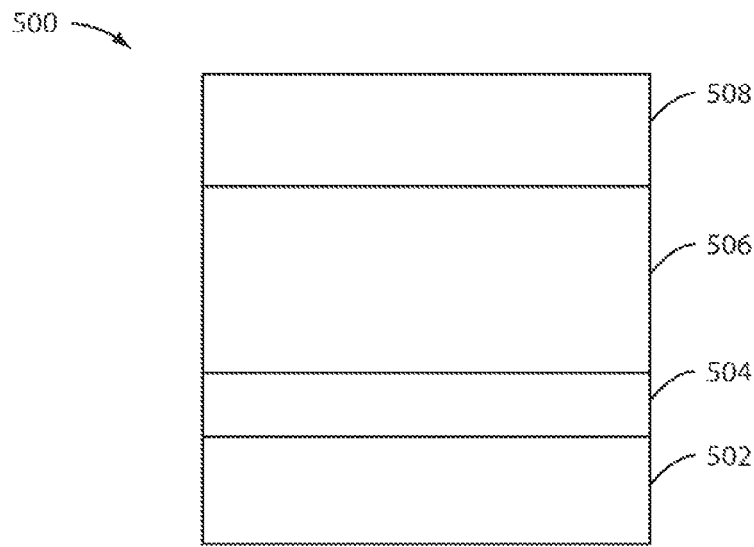
FIG. 5 illustrates a non-volatile memory cell including a nonlinear element according to an embodiment of the present invention.

As shown in FIG. 5, to mitigate the effects of leakage current in a memory cell 500, an NLE 504 is electrically coupled in series to the top electrode 508, bottom electrode 502, and switching medium 506. An NLE 504 may be disposed between the bottom electrode 502 and switching medium 506. In other embodiments, the NLE is disposed between the top electrode 508 and the switching medium 506. Higher temperatures may be experienced by the lower portions of a semiconductor device during various semiconductor processes, so an NLE that is located lower in a stack structure may be designed to withstand higher temperatures than an NLE located further from the substrate.

Figure 6A:
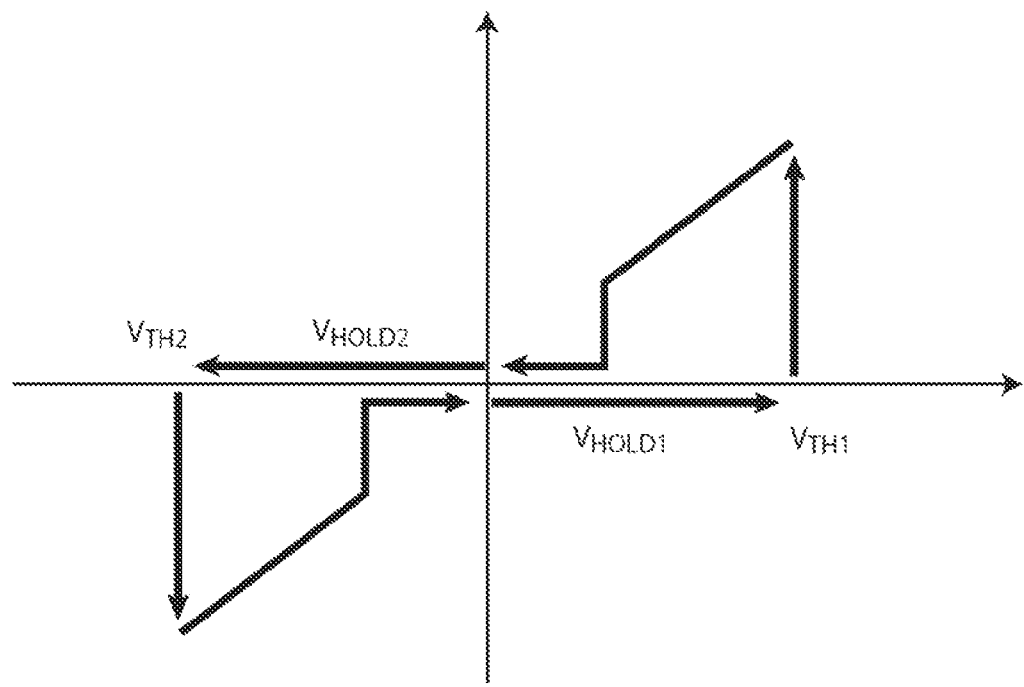
FIG. 6A illustrates characteristics of a digital nonlinear element subjected to a voltage sweep.

The behavior of a digital NLE is characterized by abrupt changes in current at certain voltages, which may be referred to as threshold voltages. Such behavior is illustrated in FIG. 6A, which shows the results of a voltage sweep in an embodiment with respect to current on an NLE that is not coupled to a resistive switching device. As positive bias voltage is applied to the NLE, the NLE is in a resistive state characterized by high resistance until it reaches the threshold voltage $V_{TH1}$. After this threshold has been reached, the NLE will retain its conductive state until the applied voltage drops below a hold voltage $V_{HOLD1}$. Thus a NLE that is in a conductive state by having a voltage applied above $V_{TH1}$ will continue to have a low resistance so long as a voltage above $V_{HOLD1}$ is supplied to the NLE, after which it reverts to the original high-resistance state. An NLE does not have a memory characteristic, so the same I-V relationship is experienced every time a voltage is applied from an original state.

Referring back to FIG. 6A, when a negative bias voltage is applied that is more negative than a threshold voltage $V_{TH2}$, an abrupt transition is experienced, and the resistance in the NLE is significantly reduced. The NLE retains its low resistance state until the voltage becomes less negative than a value $V_{HOLD2}$, at which point the NLE reverts to an original high resistance state. Although FIG. 6A shows an embodiment with symmetrical I-V behavior between positive and negative bias performance, in other embodiments the relationship is not symmetrical.

Figure 6B:
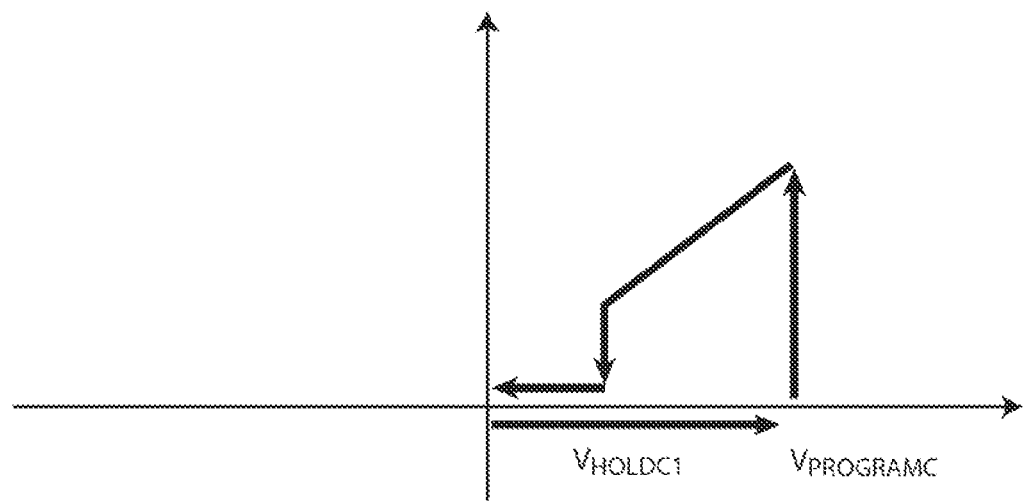
FIG. 6B illustrates I-V characteristics of a switch combined with a digital nonlinear element in an initially OFF state subjected to a positive voltage sweep.

FIGS. 6B to 6E show I-V relationships of an embodiment where an NLE is coupled to a memory cell ("combined device"), in this case a digital NLE. Memory cell 500 is an example of such a combined device. If the memory cell depicted in those figures was not coupled to the NLE, it would have an I-V response according to FIG. 2. Turning to FIG. 6B, an I-V curve showing a program operation switching a cell from an initially OFF state to an ON state is shown. To establish a conductive ON state in a cell, a voltage above $V_{PROGRAMC}$ is applied. $V_{PROGRAMC}$ is the program voltage for the combined device, which switches the combined device from an OFF state to an ON state. $V_{HOLD1}$ is the hold voltage of a combined device, which performs in essentially the same way as $V_{HOLD1}$ described above. In a preferred embodiment, $V_{HOLD1}$ is less than $V_{TH1}$, which is less than $V_{PROGRAM}$.

The relationships between I-V performance in a memory cell, an NLE, and a combined device can also be explained through equations. The equations assume that both the NLE and the switching medium switch instantly (e.g., a few ns~a few hundreds of ns) when experiencing a threshold voltage. In addition to the definitions given above, the following variables are designated:
$R_{MOFF}$=The OFF state resistance of a memory element
$R_{MON}$=The ON state resistance of a memory element
$R_{NOFF}$=The OFF state resistance of an NLE
$R_{NON}$=The ON state resistance of an NLE Using these variables, the relationship between the hold voltage of a combined device and the hold voltage of an NLE can be expressed as:

$$V_{HOLDC1} = \frac{R_{MON} + R_{NON}}{R_{NON}} V_{HOLD1}$$

The value for the program voltage of the combined device can be expressed as:

$$V_{PROGRAMC} \cong \text{small}\left\{\text{large}\left(\frac{R_{MOFF} + R_{NOFF}}{R_{NOFF}} V_{TH1}, V_{PROGRAM}\right),\right.$$
$$\left.\text{large}\left(V_{TH1}, \frac{R_{MOFF} + R_{NOFF}}{R_{MOFF}} V_{PROGRAM}\right)\right\}$$

Where "small" indicates the smaller of two values in a set, and "large" indicates the larger of two values in a set. In most embodiments, the $V_{PROGRAM}$ is significantly higher than $V_{TH1}$, and $V_{PROGRAMC}$ is thus similar to $V_{PROGRAM}$.

Figure 6C:
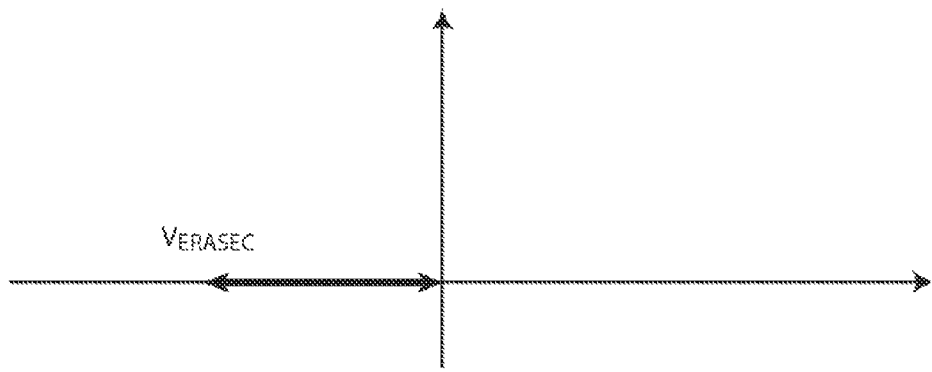
FIG. 6C illustrates I-V characteristics of a switch combined with a digital nonlinear element in an initially OFF state subjected to a negative voltage sweep.

FIG. 6C shows the result of a negative voltage sweep of the same switch in an OFF state. Because it is already in the OFF state, a negative voltage does not cause an erase operation, and the cell remains in a high resistance OFF state.

Figure 6D:
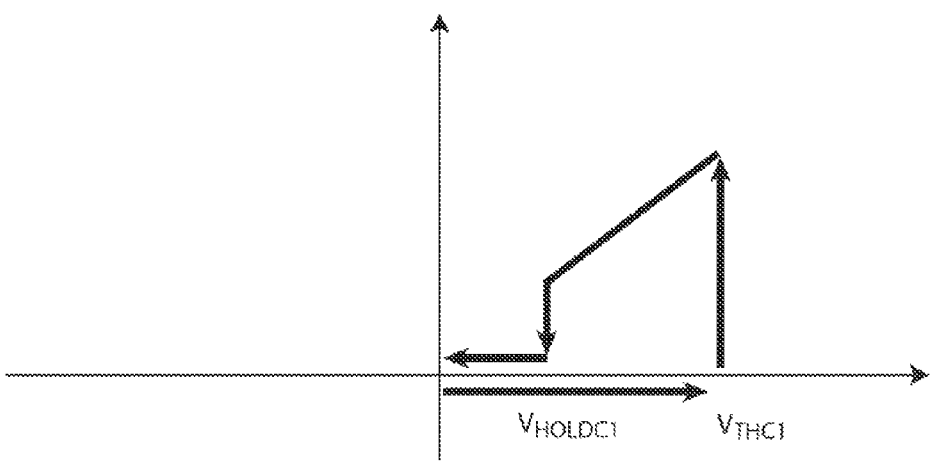
FIG. 6D illustrates I-V characteristics of a switch combined with a digital nonlinear element in an initially ON state subjected to a positive voltage sweep.
Figure 6E:
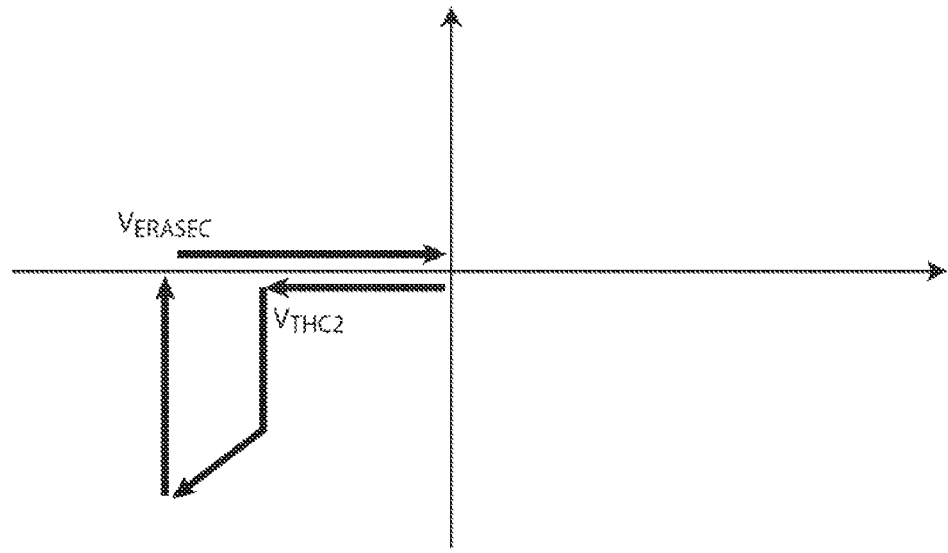
FIG. 6E illustrates I-V characteristics of a switch combined with a digital nonlinear element in an initially ON state subjected to a negative voltage sweep.

FIGS. 6D and 6E show I-V relationships of a combined device (e.g. memory cell 500) where the memory cell is initially in a low-resistance ON state. FIG. 6D shows a read operation, where the read voltage must be greater than threshold voltage $V_{THC1}$ to return an accurate read value. As the read voltage drops below the hold voltage $V_{HOLDC1}$, the resistance in the cell increases substantially. The threshold voltage of the combined device is related to the threshold voltage of the NLE through the following equation:

$$V_{THC1} = \frac{R_{MON} + R_{NOFF}}{R_{NOFF}} V_{TH1} \cong V_{TH1}$$

Thus, the read threshold voltage of the combined device is approximately the same as the threshold voltage of the NLE, or $V_{THC1} \approx V_{TH1}$.

Similarly, as seen in FIG. 6E, an erase operation must overcome a second threshold value $V_{THC2}$ to allow current to start flowing through the cell, and the switch is changed to a high-resistance OFF state at voltage $V_{ERASEC}$. Like the positive threshold voltage, the negative threshold voltage of the combined device is about the same as the negative threshold voltage of the NLE. The value of the erase voltage $V_{ERASEC}$ in a combined device can be expressed as:

$$V_{ERASEC} \cong \text{large}\left(\frac{R_{MON} + R_{NON}}{R_{MON}} V_{ERASE}, V_{TH2}\right)$$

The relationship between the negative threshold voltages of a discrete and combined device can be expressed as:

$$V_{THC2} = \frac{R_{MON} + R_{NOFF}}{R_{NOFF}} V_{TH2} \cong V_{TH2}$$

So that in most embodiments. $V_{THC2} \approx V_{TH2}$.

Various embodiments of a digital NLE can be made of many different materials. For example, a digital NLE can be a threshold device such as a film that experiences a field-driven metal-insulating (Mott) transition. Such materials are known in the art, and include $VO_2$ and doped semiconductors. Other threshold devices include material that experiences resistance switching due to electronic mechanisms observed in metal oxides and other amorphous films, or other volatile resistive switching devices such as devices based on anion or cation motion in oxides, oxide heterostructures, or amorphous films. A digital NLE can also be in the form of a breakdown element exhibiting soft breakdown behavior such as $SiO_2HfO_2$, and other dielectrics. Examples of such breakdown elements are described in further detail by application Ser. No. 12/826,653, filed on Jun. 29, 2010, which is entitled "Rectification Element for Resistive Switching for Non-volatile Memory Device and Method," and is incorporated by reference in its entirety.

As is known in the art, the precise values of threshold, hold, program and erase can be adjusted for different embodiments by changing the form of and materials used for the NLE and the memory cell. In various embodiments the threshold voltage for the NLE can be about the same as the hold voltage, the program voltage, or both. In other embodiments the threshold voltage for the NLE can exceed the program and erase voltages of a resistive switching device.

Figure 7A:
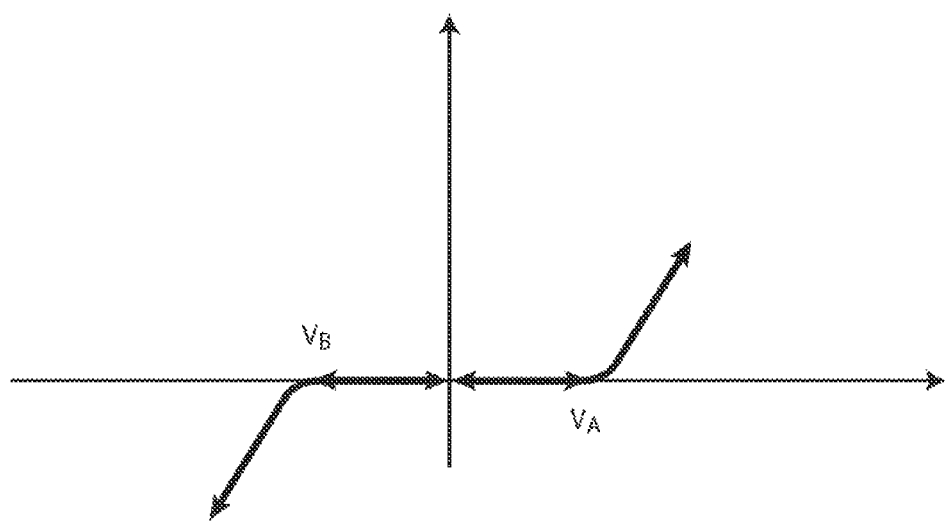
FIG. 7A illustrates I-V characteristics of an analog nonlinear element subjected to a positive voltage sweep.

An analog NLE differs from a digital NLE in that its I-V relationship is characterized by a more gradual transition when current starts to flow through the element. As shown in FIG. 7A, which illustrates the response of an analog NLE to a voltage sweep, the current transition follows an exponential-like curve. The transition or threshold is therefore less abrupt than a digital NLE. Threshold voltage values where substantial current starts to flow through an analog NLE are designated as $V_A$ and $V_B$ for positive and negative bias values, respectively. Another significant difference between an analog and digital NLE is that an analog NLE does not experience the hysteretic hold voltage characteristic of a digital NLE.

Figure 7B:
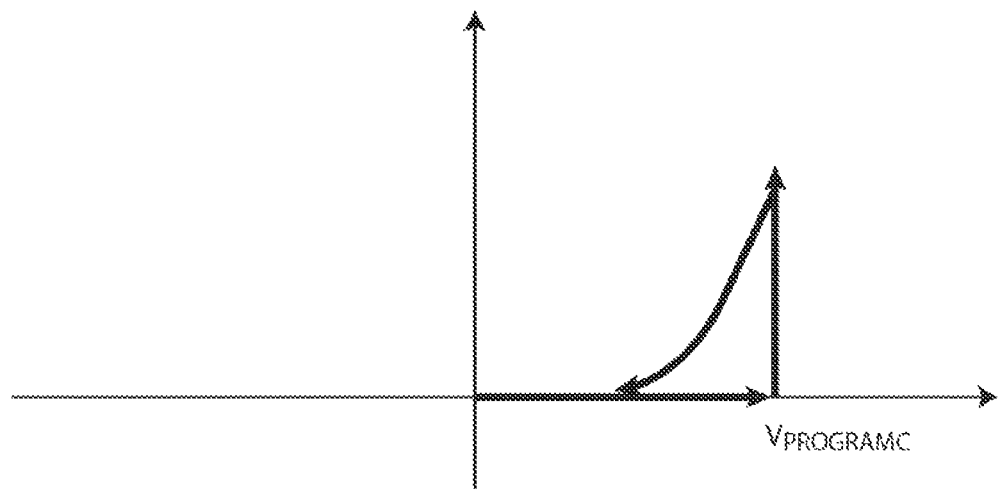
FIG. 7B illustrates I-V characteristics of a switch combined with an analog nonlinear element in an initially OFF state subjected to a positive voltage sweep.

FIGS. 7B to 7E show I-V characteristics of a combined device with an analog NLE. As shown in FIG. 7B, when a program voltage $V_{PROGRAMC}$ is applied to a combined device where the switch is initially in an OFF state, the switch changes to a low resistance ON state. The $V_{PROGRAMC}$ is approximately the sum of the $V_A$ of the NLE and the $V_{PROGRAM}$ of the switch as shown in FIG. 2, or $V_{PROGRAMC} \approx V_A + V_{PROGRAM}$. As a result, the programming voltage of a combined device with an analog NLE is typically higher than the programming voltage of a switching element alone.

Figure 7C:
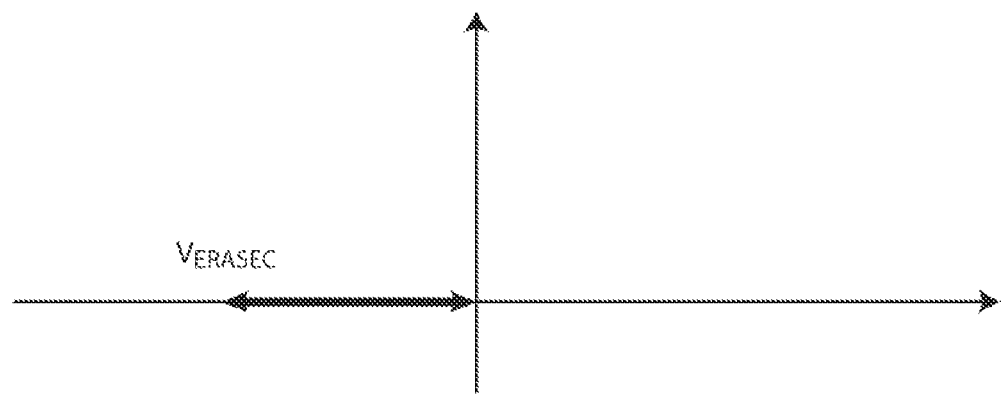
FIG. 7C illustrates I-V characteristics of a switch combined with an analog nonlinear element in an initially OFF state subjected to a negative voltage sweep.

Turning now to FIG. 7C, a negative voltage sweep of a combined device in an OFF state is shown. Because the switch is already in an OFF state, the negative voltage does not induce a state change, and the switch remains in a high resistance state.

Figure 7D:
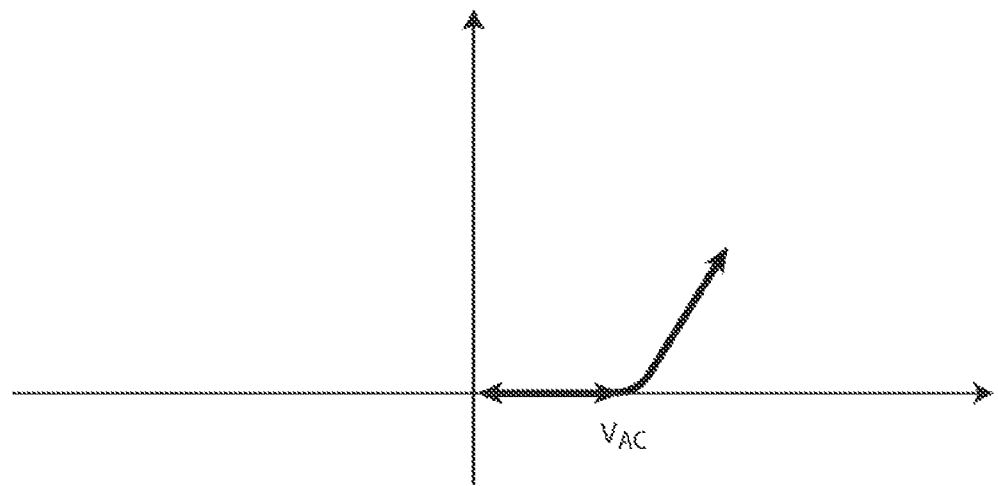
FIG. 7D illustrates I-V characteristics of a switch combined with an analog nonlinear element in an initially ON state subjected to a positive voltage sweep.

FIG. 7D shows the result of a read operation in a combined switch that is in an ON state. In the present embodiment, $V_{AC} < V_{READ} < V_{PROGRAMC}$. Because the switch is already in a low-resistance ON state, current flow above the threshold voltage $V_{AC}$ is characterized by low resistance. Circuitry can detect the current flow, resulting in a positive read result. The value for $V_A$ is not affected by the switching apparatus in most embodiments, so typically $V_{AC} \approx V_A$.

Figure 7E:
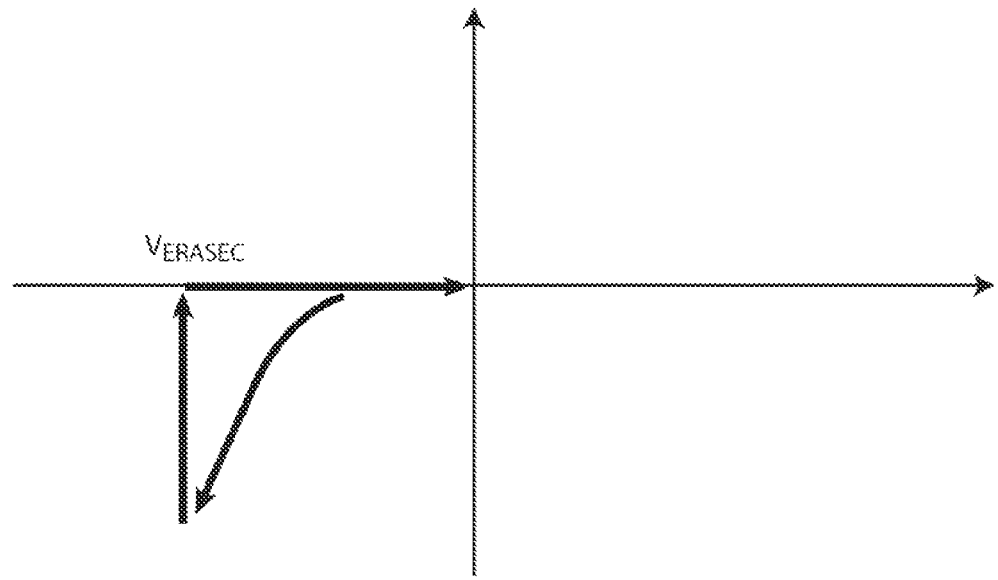
FIG. 7E illustrates I-V characteristics of a switch combined with an analog nonlinear element in an initially ON state subjected to a negative voltage sweep.

FIG. 7E shows an I-V curve for an erase operation in a combined device. To change the switch from the ON state to the OFF state, a voltage of $V_{ERASEC}$ is applied to the combined device, thereby increasing the resistance of the switch. The voltage required to complete an erase operation in a combined device is normally the sum of the erase value of the discrete switch and the threshold value of the analog NLE, or $V_{ERASEC} \approx V_{ERASE} + V_B$.

An analog NLE can be any element that exhibits the above described behavior. Examples of suitable materials include a punch-through diode, a Zener diode, an impact ionization (or avalanche) element, and a tunneling element such as a tunneling barrier layer. Such elements can be fabricated using standard fabrication techniques.

In most embodiments, $|V_A, V_B| V_{PROGRAM}, V_{ERASE}|$. As is known in the art, the precise threshold values of $V_A$, $V_B$, program, and erase can be adjusted for different embodiments by changing the form of and materials used for the NLE and the memory cell. In various embodiments the threshold voltage for the NLE can be about the same as the program voltage. In other embodiments the threshold voltage can exceed the program and erase voltages.

In other embodiments, a resistive switching cell may be configured to retain multiple resistive states. That is, rather than being configured to have binary states of ON and OFF, a cell can retain a plurality of resistance states. An array of such switches has the same limitations regarding leakage current, and would similarly benefit from the inclusion of an NLE.

The examples and embodiments described herein are for illustrative purposes only and are not intended to be limiting. Various modifications or alternatives in light thereof will be suggested to persons skilled in the art and are to be included within the spirit and purview of this application and scope of the appended claims.

What is claimed is:

1. A switching device comprising:
a first electrode layer formed over a substrate;
a nonlinear element disposed adjacent to the first electrode wherein the non-linear element is associated with an active threshold voltage and a hold threshold voltage;
a resistive switching material disposed adjacent to the nonlinear element, wherein the resistive switching material comprises a plurality of defect sites, wherein the resistive switching material is associated with a program threshold voltage; and
a second electrode layer disposed adjacent to the resistive switching material, wherein the second electrode layer comprises a plurality of metal particles;
wherein metal particles from the plurality of metal particles are disposed within defect sites of the resistive switching material, wherein a metal particle from the metal particles is separated from the non-linear element by a plurality of tunneling distances, wherein the plurality of tunneling distances are associated with a plurality of tunneling resistances, and wherein a state of the two-terminal memory device is associated with a tunneling resistance of the plurality of tunneling resistances; and
wherein the active threshold voltage is less than the program threshold voltage.

2. The device of claim 1, wherein the resistive switching material is associated with a read threshold voltage; and
wherein the active threshold voltage is less than the read threshold voltage.

3. The device of claim 2, wherein the nonlinear element is selected from a group consisting of: a $VO_2$ film, a volatile resistive switching device, a breakdown element, a metal oxide, SiO2, a dielectric, a film having field-driven metal-insulating (Mott) transitions.

4. The device of claim 1, wherein the non-linear element is associated with a high resistance and a low resistance;

wherein the non-linear element is characterized by the low resistance state upon application of a voltage greater than the active threshold voltage.

5. The device of claim 4, wherein the non-linear element is characterized by the low resistance state after application of the voltage greater than the active threshold voltage and before application of a voltage less than the hold threshold voltage.

6. The device of claim 1, wherein the second electrode layer is selected from a group consisting of: silver, gold, nickel, aluminum, chromium, iron, manganese, tungsten, vanadium, and cobalt.

7. The device of claim 1, wherein the non-linear element is associated with a high resistance and a low resistance;
   wherein the nonlinear element is associated with a lower active threshold voltage; and
   wherein the non-linear element is characterized by the high resistance state upon application of a voltage greater than the lower active threshold voltage and less than the hold threshold voltage.

8. The device of claim 7, wherein the nonlinear element is characterized by the low resistance state upon application of a voltage less than the lower active threshold voltage.

9. The device of claim 1, wherein a state of the two-terminal memory device is associated with a low resistance state upon application of a voltage greater than the program threshold voltage.

10. The device of claim 1 wherein the resistive switching includes an amorphous silicon.

11. The device of claim 1 wherein a state of the two-terminal memory device is not changed upon application of a voltage greater than a read threshold voltage but less than the program threshold voltage.

12. A method for a switching device comprises:
   applying a read voltage across a first electrode from a plurality of top electrodes and a first bottom electrode from a plurality of bottom electrodes, wherein a plurality of switching devices are formed between intersections of top electrodes from the plurality of top electrodes and bottom electrodes from the plurality of bottom electrodes, wherein each of the plurality of switching devices comprises a nonlinear element disposed adjacent to a bottom electrode, wherein the nonlinear element is associated with an active threshold voltage and a hold threshold voltage, wherein each of the plurality of switching devices also comprises a resistive switching material disposed adjacent to the nonlinear element and to a top electrode, wherein the resistive switching material comprises a plurality of defect sites, wherein the resistive switching material is associated with a program threshold voltage, wherein the plurality of top electrodes comprise a plurality of metal particles, wherein metal particles from the plurality of metal particles are disposed within defect sites of the resistive switching material, wherein a metal particle from the metal particles is separated from the non-linear element by a plurality of tunneling distances, wherein the plurality of tunneling distances are associated with a plurality of tunneling resistances; and
   determining a tunneling resistance of the switching device in response to the read voltage; and
   wherein the read voltage is greater than active threshold voltage of the nonlinear element.

* * * * *